US008686507B2

(12) United States Patent
Su et al.

(10) Patent No.: US 8,686,507 B2
(45) Date of Patent: *Apr. 1, 2014

(54) SYSTEM AND METHOD FOR I/O ESD PROTECTION WITH FLOATING AND/OR BIASED POLYSILICON REGIONS

(75) Inventors: Ting Chieh Su, Nantou (CN); Min Chie Jeng, Cupertino, CA (US); Chin Chang Liao, Shanghai (CN); Jun Cheng Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 531 days.

This patent is subject to a terminal disclaimer.

(21) Appl. No.: 11/517,546

(22) Filed: Sep. 6, 2006

(65) Prior Publication Data

US 2007/0164362 A1 Jul. 19, 2007

(30) Foreign Application Priority Data

Jan. 4, 2006 (CN) .......................... 2006 1 0023162

(51) Int. Cl.
*H01L 23/62* (2006.01)

(52) U.S. Cl.
USPC ............................. 257/355; 257/356; 257/401

(58) Field of Classification Search
USPC ........................................ 257/355–363, 401
See application file for complete search history.

(56) References Cited

U.S. PATENT DOCUMENTS

| 4,148,047 | A | * | 4/1979 | Hendrickson | 257/342 |
| 5,034,785 | A | * | 7/1991 | Blanchard | 257/330 |
| 5,164,806 | A | * | 11/1992 | Nagatomo et al. | 257/395 |
| 5,517,049 | A | | 5/1996 | Huang | |
| 6,639,283 | B1 | | 10/2003 | Hung et al. | |
| 6,690,067 | B2 | * | 2/2004 | Ker et al. | 257/355 |
| 7,078,775 | B2 | * | 7/2006 | Yi et al. | 257/401 |
| 7,265,041 | B2 | * | 9/2007 | Wu et al. | 438/587 |
| 7,642,602 | B2 | | 1/2010 | Su et al. | |
| 2002/0076402 | A1 | | 6/2002 | Khouri et al. | |
| 2002/0149059 | A1 | | 10/2002 | Ker et al. | |
| 2003/0210359 | A1 | * | 11/2003 | Lee et al. | 349/43 |
| 2004/0007742 | A1 | | 1/2004 | Cheng et al. | |

FOREIGN PATENT DOCUMENTS

CN  1360347 A  7/2002

OTHER PUBLICATIONS

Non-Final Office Action for U.S. Appl. No. 12/623,363, mailed on Jul. 21, 2011, 9 pages.
Final Office Action for U.S. Appl. No. 12/623,363, mailed on Jan. 5, 2011, 8 pages.

(Continued)

*Primary Examiner* — Ori Nadav
(74) *Attorney, Agent, or Firm* — Kilpatrick Townsend & Stockton LLP

(57) ABSTRACT

A system and method for electrostatic discharge protection. The system includes a plurality of transistors. The plurality of transistors includes a plurality of gate regions, a plurality of source regions, and a plurality of drain regions. The plurality of source regions and the plurality of drain regions are located within an active area in a substrate, and the active area is adjacent to at least an isolation region in the substrate. Additionally, the system includes a polysilicon region. The polysilicon region is separated from the substrate by a dielectric layer, and the polysilicon region intersects each of the plurality of gate regions. At least a part of the polysilicon region is on the active area.

12 Claims, 13 Drawing Sheets

(56) References Cited

OTHER PUBLICATIONS

Non-Final Office Action for U.S. Appl. No. 12/623,363, mailed on Jul. 22, 2010, 8 pages.
Non-Final Office Action for U.S. Appl. No. 11/550,529, mailed on Feb. 23, 2009, 8 pages.
Notice of Allowance for U.S. Appl. No. 11/550,529, mailed on Aug. 20, 2009, 7 pages.
Requirement for Restriction/Election for U.S. Appl. No. 12/623,363, mailed on Jun. 9, 2010, 7 pages.
Requirement for Restriction/Election for U.S. Appl. No. 11/550,529, mailed on Dec. 15, 2008, 7 pages.
Final Office Action for U.S. Appl. No. 12/623,363, mailed on Jan. 23, 2012, 8 pages.
Requirement for Restriction/Election for U.S. Appl. No. 12/979,306, mailed on Jan. 23, 2012, 6 pages.
Notice of Allowance for U.S. Appl. No. 12/979,306, mailed on Jul. 24, 2012, 4 pages.
*Ex parte Quayle* Action for U.S. Appl. No. 12/979,306, mailed on May 11, 2012, 11 pages.
Notice of Allowance for U.S. Appl. No. 12/623,363, mailed on May 17, 2012, 9 pages.

\* cited by examiner

SYSTEM AND METHOD FOR I/O ESD PROTECTION WITH FLOATING AND/OR BIASED POLYSILICON REGIONS

CROSS-REFERENCES TO RELATED APPLICATIONS

This application claims priority to Chinese Patent Application No. 200610023162.2, filed Jan. 4, 2006, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits. More particularly, the invention provides a system and method for electrostatic discharge (ESD) protection with floating and/or biased polysilicon regions. Merely by way of example, the invention has been applied to input/output (I/O) devices. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process and/or device layout often work down to only a certain feature size. An example of such a limit is the ESD protection provided by I/O transistors. An effective protection often requires lowering breakdown voltages of the I/O transistors, but reducing the breakdown voltages can be difficult. Conventionally, an ESD implant has been used for adjusting the breakdown voltages, but the ESD implant often increases fabrication complexity with limited effectiveness.

From the above, it is seen that an improved technique for ESD protection is desired.

BRIEF SUMMARY OF THE INVENTION

The present invention is directed to integrated circuits. More particularly, the invention provides a system and method for electrostatic discharge (ESD) protection with floating and/or biased polysilicon regions. Merely by way of example, the invention has been applied to input/output (I/O) devices. But it would be recognized that the invention has a much broader range of applicability.

In a specific embodiment, the invention provides a system for electrostatic discharge protection. The system includes a plurality of transistors. The plurality of transistors includes a plurality of gate regions, a plurality of source regions, and a plurality of drain regions. The plurality of source regions and the plurality of drain regions are located within an active area in a substrate, and the active area is adjacent to at least an isolation region in the substrate. Additionally, the system includes a polysilicon region. The polysilicon region is separated from the substrate by a dielectric layer, and the polysilicon region intersects each of the plurality of gate regions. At least a part of the polysilicon region is on the active area.

According to another embodiment of the present invention, a system for electrostatic discharge protection includes a plurality of transistors. The plurality of transistors includes a plurality of gate regions, a plurality of source regions, and a plurality of drain regions. The plurality of source regions and the plurality of drain regions are located within an active area in a substrate, and the active area is adjacent to at least an isolation region in the substrate.

Additionally, the system includes a first plurality of polysilicon regions. The first plurality of polysilicon regions is separated from the substrate by a first plurality of dielectric layers. At least a part of each of the first plurality of polysilicon regions is on the active area, and the first plurality of polysilicon regions are not in direct contact with each other.

According to yet another embodiment of the present invention, a system for electrostatic discharge protection includes a plurality of transistors. The plurality of transistors includes a plurality of gate regions, a plurality of source regions, and a plurality of drain regions. The plurality of source regions and the plurality of drain regions are located within an active area in a substrate, and the active area is adjacent to at least an isolation region in the substrate. Additionally, the system includes a plurality of polysilicon regions. The plurality of polysilicon regions is separated from the substrate by a plurality of dielectric layers. The plurality of polysilicon regions is on one of the plurality of drain regions or one of the plurality of source regions. The plurality of polysilicon regions is not in direct contact with each other, and each of the plurality of polysilicon region is not in direct contact with anyone of the plurality of gate regions.

Many benefits are achieved by way of the present invention over conventional techniques. For example, the present technique provides an easy to use system and method. According to certain embodiments, the system and method are compatible with conventional technology. Some embodiments of the present invention improve the I/O ESD protection technique. For example, the junction breakdown voltages of MOS transistors are lowered. In another example, the I/O transistors can turn on junction breakdown and thus prevent or reduce damages for self-protection from ESD stress. Certain embodiments of the present invention can effectively delay the time when the ESD stress current reaches the gate regions. Some embodiments of the present invention comply with the ESD design rule. For example, to dissipate significant heat generated by high-density ESD current, the ESD design rule often allows relatively large spacing between the gate regions and drain contacts. In another example, the polysilicon regions can be inserted to the drain regions of the I/O transistors in order to increase lengths of the current paths and raise the drain resistance without violating the ESD design rule.

Certain embodiments of the present invention provide pocket implant regions adjacent to floating and/or biased polysilicon regions. For example, the pocket implant regions are made with the pocket implant process used for making I/O transistors. In another example, the pocket implant is more heavily doped than p-well in the substrate, and the source and drain regions include N+ regions. The pocket implant regions and the N+ regions form abrupt junctions with low junction breakdown voltage. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a system and method for electrostatic discharge (ESD) protection with floating and/or biased polysilicon regions. Merely by way of example, the invention has been applied to input/output (I/O) devices. But it would be recognized that the invention has a much broader range of applicability.

Figure 1:
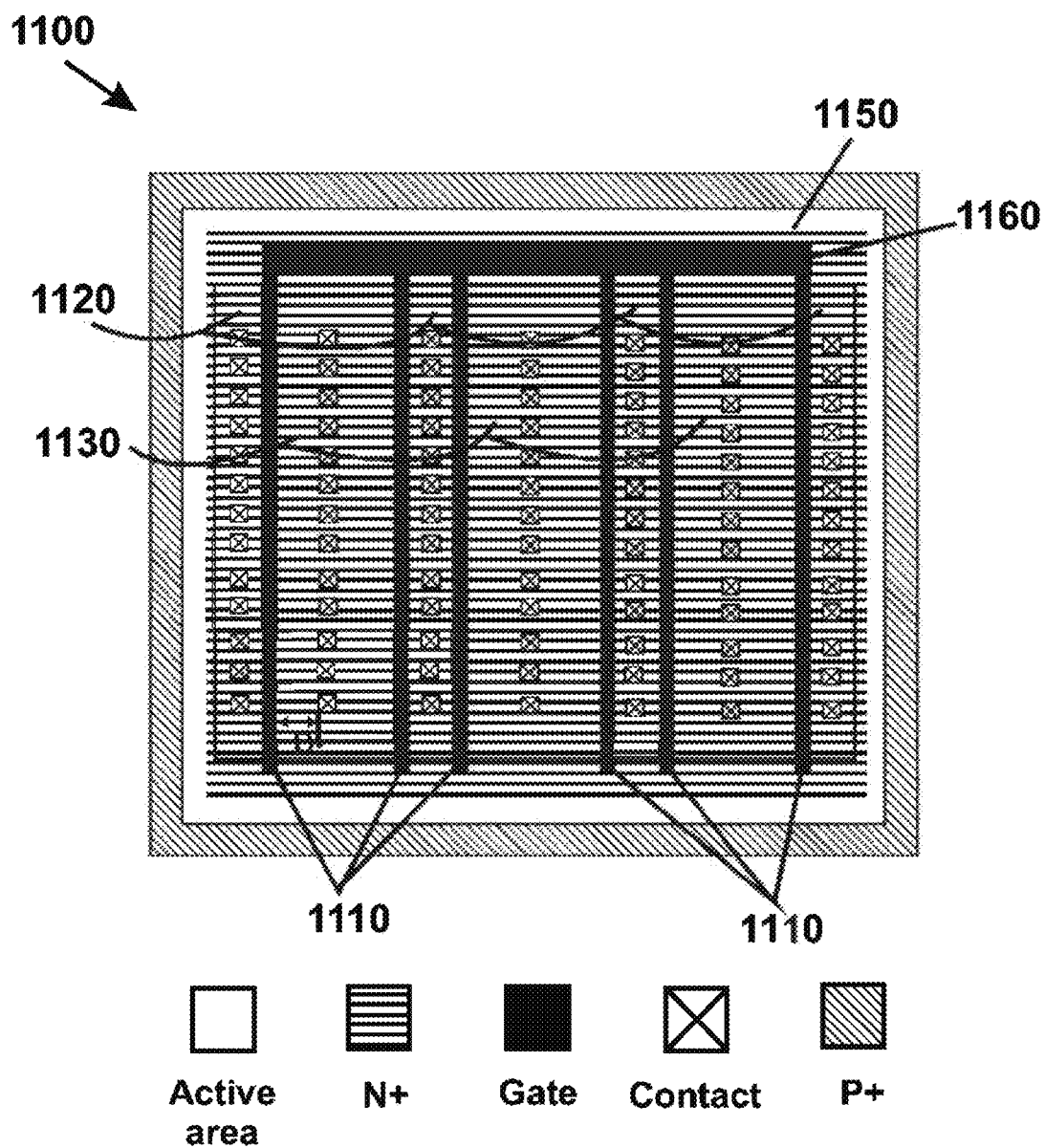
FIG. 1 is a simplified conventional system for electrostatic discharge protection.

FIG. 1 is a simplified conventional system for electrostatic discharge protection. The system 1100 includes gate regions 1110, source regions 1120, drain regions 1130, an active area 1150, and a polysilicon region 1160. The gate regions 1110, the source regions 1120, and the drain regions 1130 are used to form I/O transistors in the active area 1150. The gate regions are electrically shorted to each other by the polysilicon region 1160, and the polysilicon region 1160 is located completely outside the active area 1150.

Figure 2:
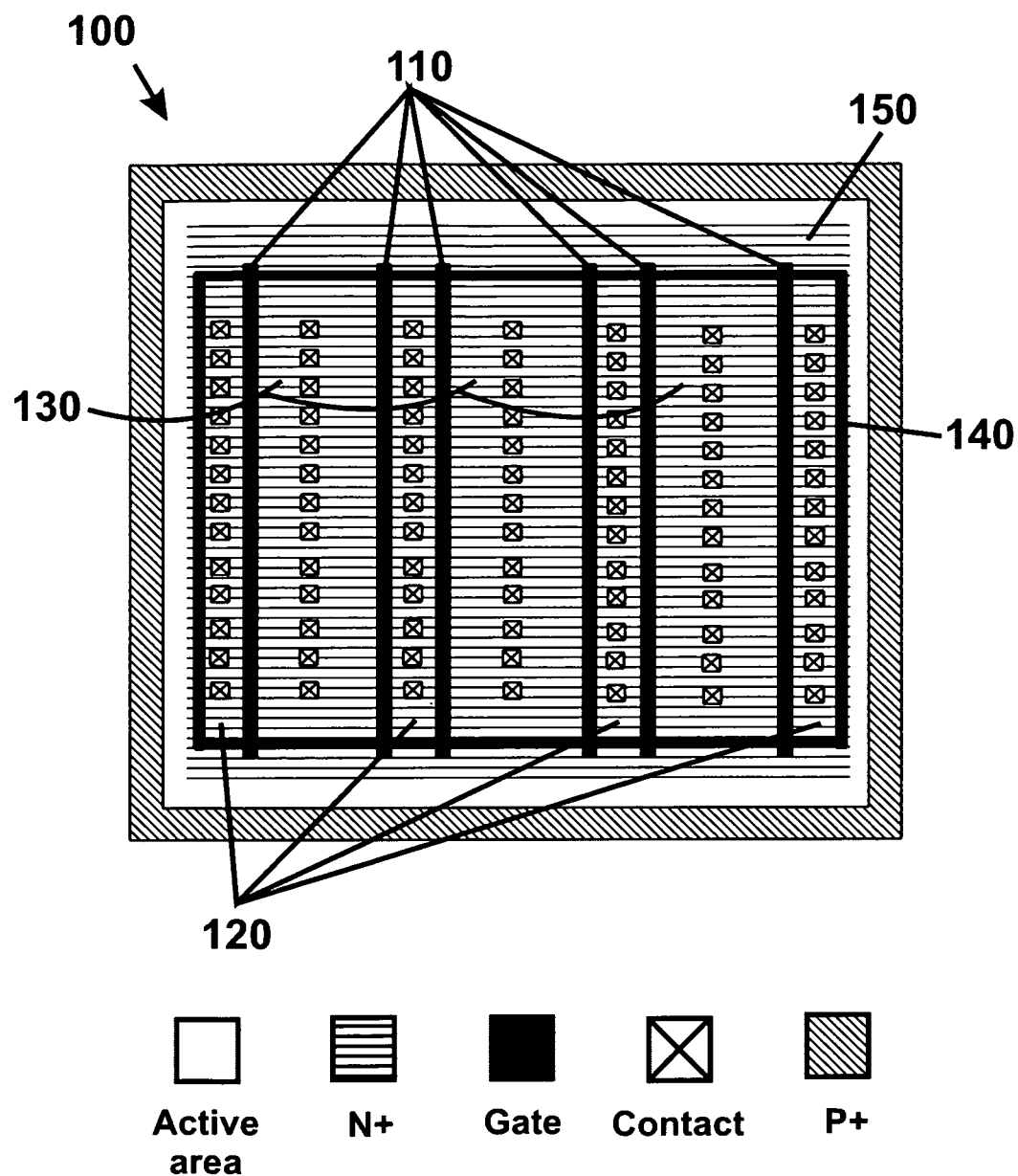
FIG. 2 is a simplified system for electrostatic discharge protection according to an embodiment of the present invention.

FIG. 2 is a simplified system for electrostatic discharge protection according to an embodiment of the present invention. This diagram is merely an example, which should not unduly limit the scope of the claims. One of ordinary skill in the art would recognize many variations, alternatives, and modifications. The system 100 includes the following components:
1. Gate regions 110;
2. Source regions 120;
3. Drain regions 130;
4. Polysilicon region 140;
5. Active area 150.

Although the above has been shown using a selected group of components for the system 100, there can be many alternatives, modifications, and variations. For example, some of the components may be expanded and/or combined. Other components may be inserted to those noted above. Depending upon the embodiment, the arrangement of components may be interchanged with others replaced. For example, the I/O transistors in the active area 150 are PMOS transistors. Further details of these components are found throughout the present specification and more particularly below.

The gate regions 110, the source regions 120, and the drain regions 130 are used to form I/O transistors in the active area 150. For example, the active area 150 includes the source regions 120 and the drain regions 130. In another example, each of the source regions 120 includes a doped region, and each of the drain regions 130 includes a doped region. In yet another example, the I/O transistors in the active area 150 are NMOS transistors. As shown in FIG. 2, the polysilicon region 140 intersects the gate regions 110. The gate regions 110 are electrically connected to the polysilicon region 140. In one embodiment, the polysilicon region 140 has the same voltage potential as the gate regions 110. In another embodiment, the polysilicon region 140 surrounds the source regions 120 and the drain regions 130. For example, the polysilicon region 140 is partially or completely located within the active area 150. In another example, the gate regions 110 are electrically shorted to each other by another polysilicon region located outside the active area 150.

Figure 3:
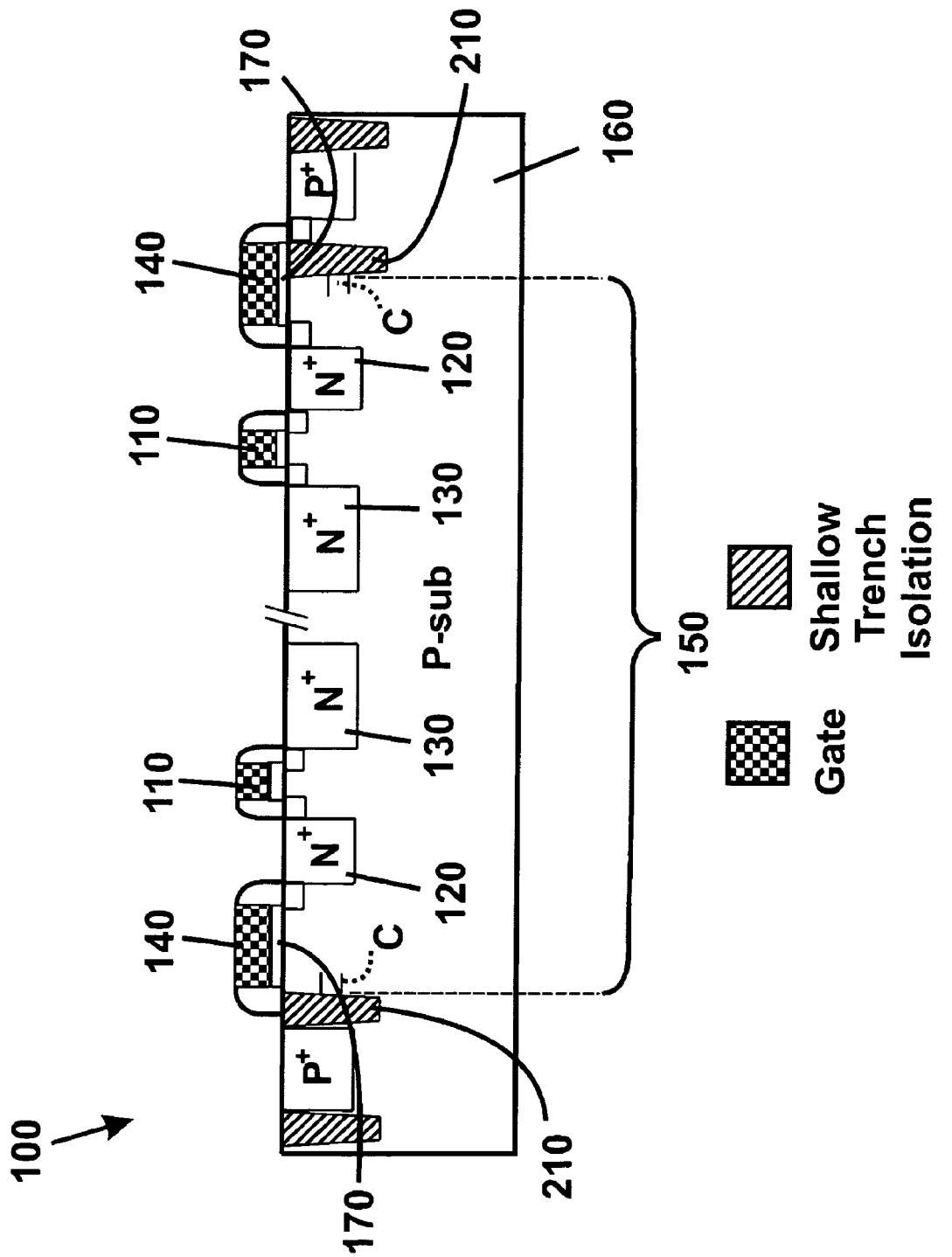
FIG. 3 is a simplified cross-section for electrostatic discharge protection according to an embodiment of the present invention.

FIG. 3 is a simplified cross-section for the system 100 for electrostatic discharge protection according to an embodiment of the present invention. This diagram is merely an example, which should not unduly limit the scope of the claims. One of ordinary skill in the art would recognize many variations, alternatives, and modifications. The system 100 also includes a substrate 160 and a dielectric layer 170. The substrate 160 includes the active area 150, and is separated from the polysilicon region 140 by the dielectric layer 170. For example, the dielectric layer 170 includes silicon oxide. As shown in FIG. 3, the active area 150 is isolated by shallow trench isolation (STI) regions 210. For example, in the top view, the polysilicon region 140 is partially located within the active area 150 for the I/O transistors.

In one embodiment, the substrate 160 is doped to p-type. The source regions 120 and the drain regions 130 include N+ regions. For example, the substrate 160 also includes a p-well. In another example, the substrate 160 also includes at least two LDD regions for each of the N+ regions. The two LDD regions are in direct contact with the corresponding N+ region. In yet another example, the substrate 160 also includes two p-type regions made by pocket implants for each of the N+ regions.

Figure 4:
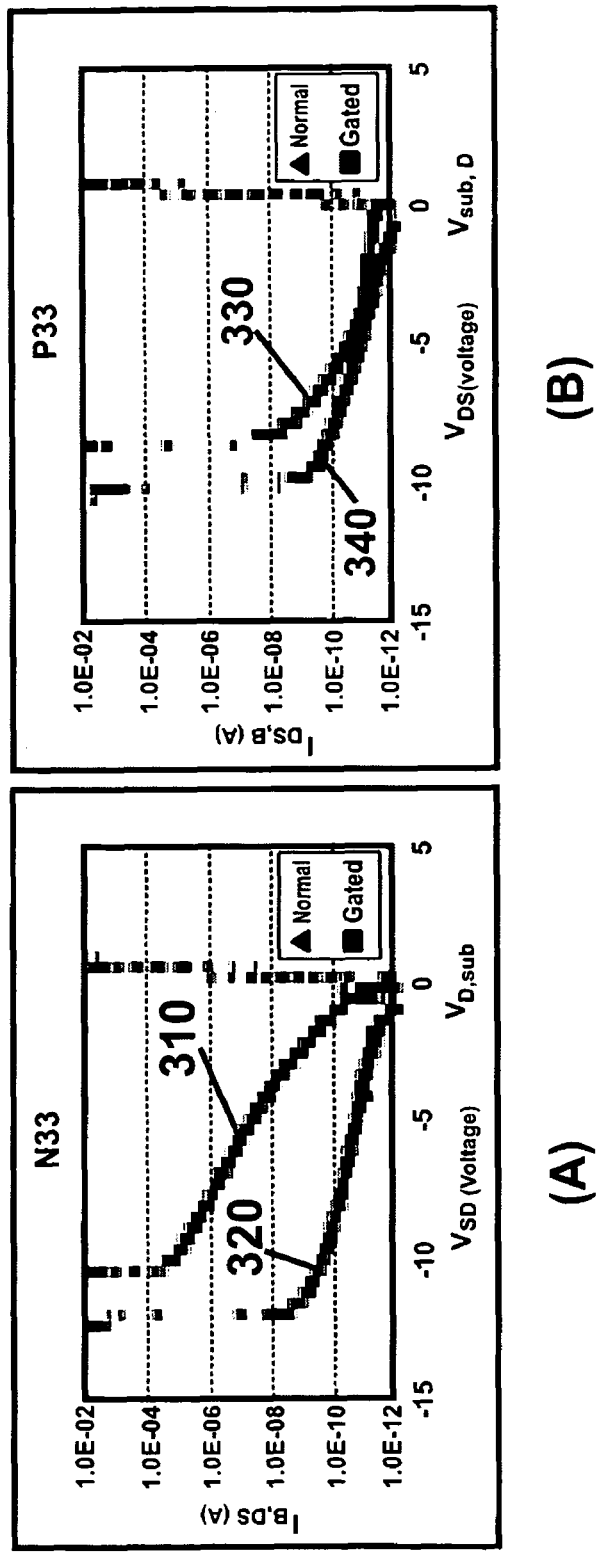
FIGS. 4(A) and (B) are simplified diagrams showing reduction of breakdown voltage for I/O transistors according to certain embodiments of the present invention.

FIGS. 4(A) and (B) are simplified diagrams showing reduction of breakdown voltage for I/O transistors according to certain embodiments of the present invention. These diagrams are merely examples, which should not unduly limit the scope of the claims. One of ordinary skill in the art would recognize many variations, alternatives, and modifications. FIG. 4(A) corresponds to the NMOS I/O transistors, and FIG. 4(B) corresponds to the PMOS I/O transistors. Additionally, curves 310 and 330 describe the I/O transistors surrounded by the polysilicon region 140 as shown in FIGS. 1 and 2, and curves 320 and 340 describe the I/O transistors not surrounded by the polysilicon region 140.

As shown in FIG. 4(A), the magnitudes of transistor current $I_{B,DS}$ have been measured as a function of the transistor voltage $V_{B,DS}$. The current $I_{B,DS}$ flows from the bulk region to the drain and source regions of the NMOS I/O transistor. The transistor voltage $V_{B,DS}$ represents the voltage drop from the bulk region to the drain and source regions, and the drain and source regions are at the same voltage potential. The comparison of the curves 310 and 320 indicates addition of the polysilicon region 140 can significantly reduce magnitude of the breakdown voltage. For example, the reduction equals about 2 volts. As shown in FIG. 4(B), the magnitudes of transistor current $I_{DS,B}$ has been measured as a function of the transistor voltage $V_{DS,B}$. The current $I_{DS,B}$ flows from the drain and source regions to the bulk region of the PMOS I/O transistor. The transistor voltage $V_{DS,B}$ represents the voltage drop from the drain and source regions to the bulk region, and the drain and source regions are at the same voltage potential. The comparison of the curves 330 and 340 indicates addition of the polysilicon region 140 can significantly reduce magnitude of the breakdown voltage. For example, the reduction equals about 2 volts.

Figure 5:
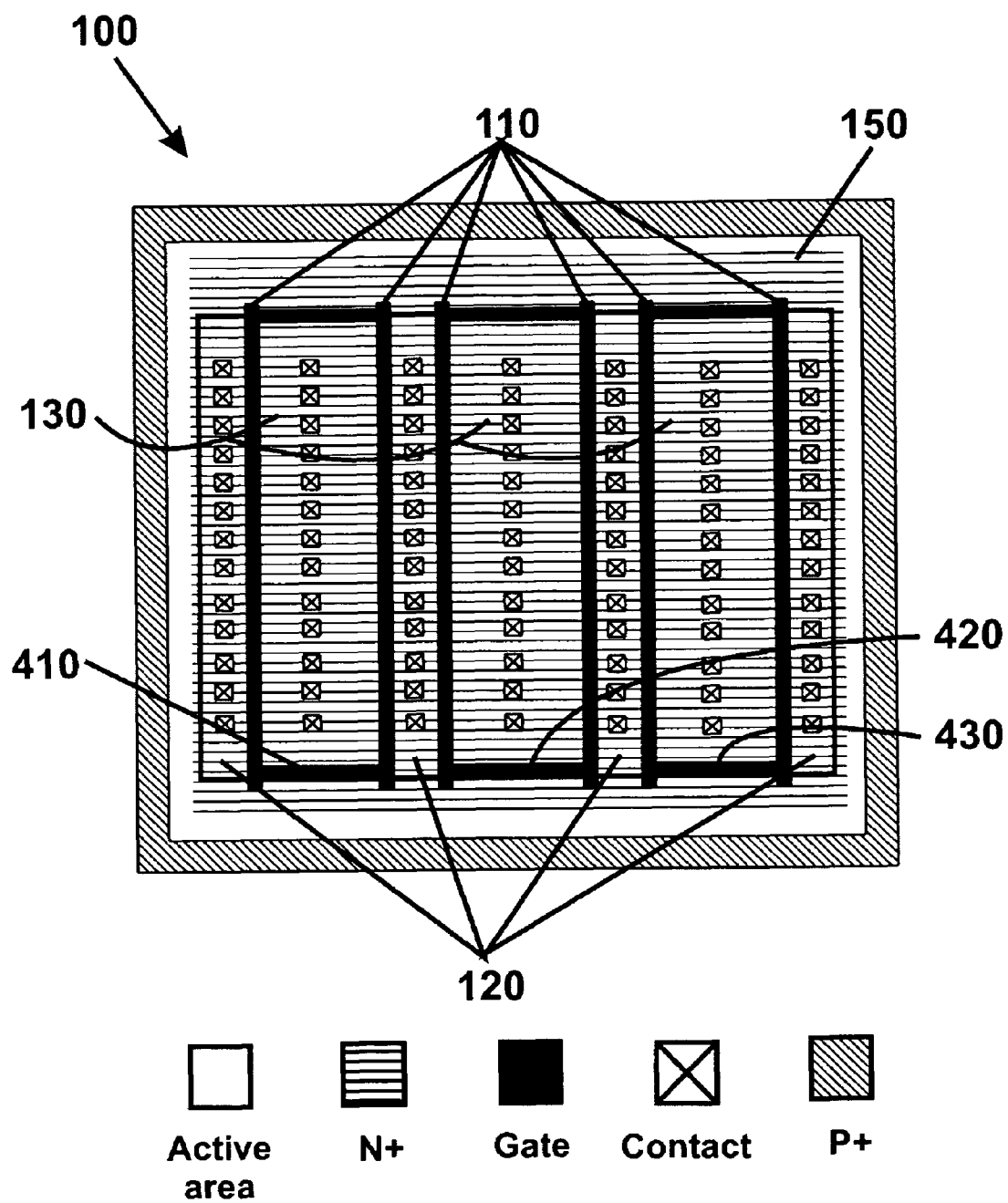
FIG. 5 is a simplified system for electrostatic discharge protection according to another embodiment of the present invention.

As discussed above and further emphasized here, FIGS. 2 and 3 are merely examples, which should not unduly limit the scope of the claims. One of ordinary skill in the art would recognize many variations, alternatives, and modifications. FIG. 5 is a simplified system for electrostatic discharge protection according to another embodiment of the present invention. The polysilicon region 140 in the system 100 is replaced by polysilicon regions 410, 420, and 430. For example, the polysilicon regions 410, 420, and 430 and the gate regions 110 surround the drain regions 130. The polysilicon regions 410, 420, and 430 are partially or completely located within the active area 150, and separated from the substrate by dielectric layers. For example, the dielectric layers include silicon oxide. In another example, the dielectric layers are separated from each other or in contact with each other. In yet another example, the gate regions 110 are electrically shorted to each other by another polysilicon region located outside the active area 150.

In one embodiment, the substrate is doped to p-type. The source regions 120 and the drain regions 130 include N+ regions. For example, the substrate also includes a p-well. In another example, the substrate 160 also includes at least two LDD regions for each of the N+ regions. The two LDD regions are in direct contact with the corresponding N+ region. In yet another example, the substrate 160 also includes two p-type regions made by pocket implants for each of the N+ regions.

Figure 6:
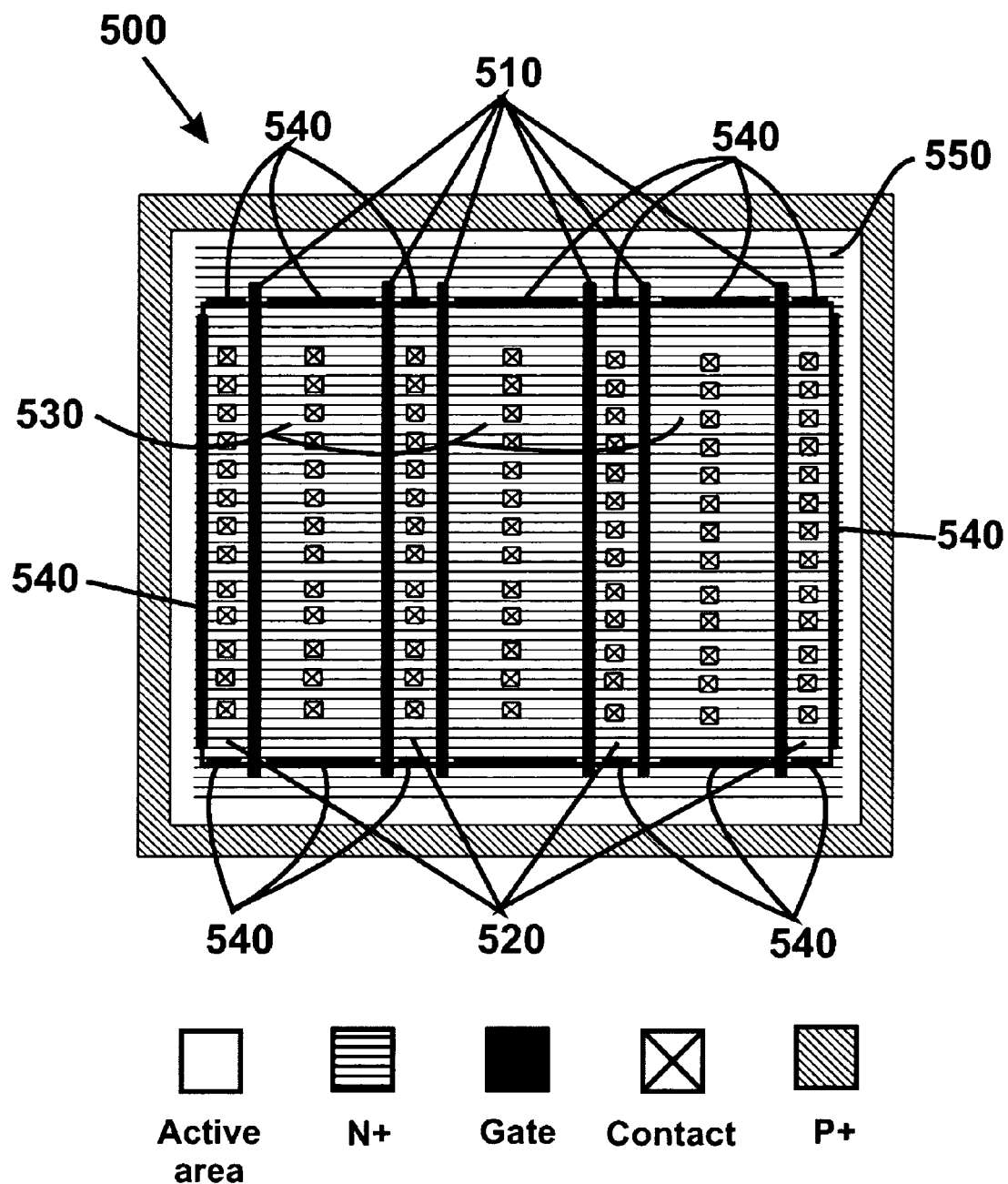
FIG. 6 is a simplified system for electrostatic discharge protection according to yet another embodiment of the present invention.

FIG. 6 is a simplified system for electrostatic discharge protection according to yet another embodiment of the present invention. This diagram is merely an example, which should not unduly limit the scope of the claims. One of ordinary skill in the art would recognize many variations, alternatives, and modifications. The system 500 includes the following components:

1. Gate regions 510;
2. Source regions 520;
3. Drain regions 530;
4. Polysilicon region 540;
5. Active area 550.

Although the above has been shown using a selected group of components for the system 500, there can be many alternatives, modifications, and variations. For example, some of the components may be expanded and/or combined. Other components may be inserted to those noted above. Depending upon the embodiment, the arrangement of components may be interchanged with others replaced. For example, the I/O transistors in the active area 550 are PMOS transistors. Further details of these components are found throughout the present specification and more particularly below.

The gate regions 510, the source regions 520, and the drain regions 530 are used to form I/O transistors in the active area 550. For example, the active area 550 includes the source regions 520 and the drain regions 530. In another example, the I/O transistors in the active area 550 are NMOS transistors. As shown in FIG. 6, the polysilicon region 540 does not intersect the gate regions 510. The gate regions 510 are not in direct contact with the polysilicon region 540. For example, the polysilicon region 540 includes a plurality of sub-regions, and the plurality of sub-regions is not in direct contact with each other.

In one embodiment, the polysilicon region 540 is at least partially around the source regions 520 and the drain regions 530. In another embodiment, the polysilicon region 540 is partially or completely located within the active area 550. In yet another embodiment, the polysilicon region 540 is separated from the substrate by dielectric layers. For example, the dielectric layers include silicon oxide. In another example, the dielectric layers are separated from each other or in direct contact with each other. In yet another embodiment, the gate regions 510 are electrically shorted to each other by another polysilicon region located outside the active area 550.

In another embodiment, the substrate is doped to p-type. The source regions 520 and the drain regions 530 include N+ regions. For example, the substrate also includes a p-well. In another example, the substrate 560 also includes at least two LDD regions for each of the N+ regions. The two LDD regions are in direct contact with the corresponding N+ region. In yet another example, the substrate 560 also includes two p-type regions made by pocket implants for each of the N+ regions.

Figure 7:
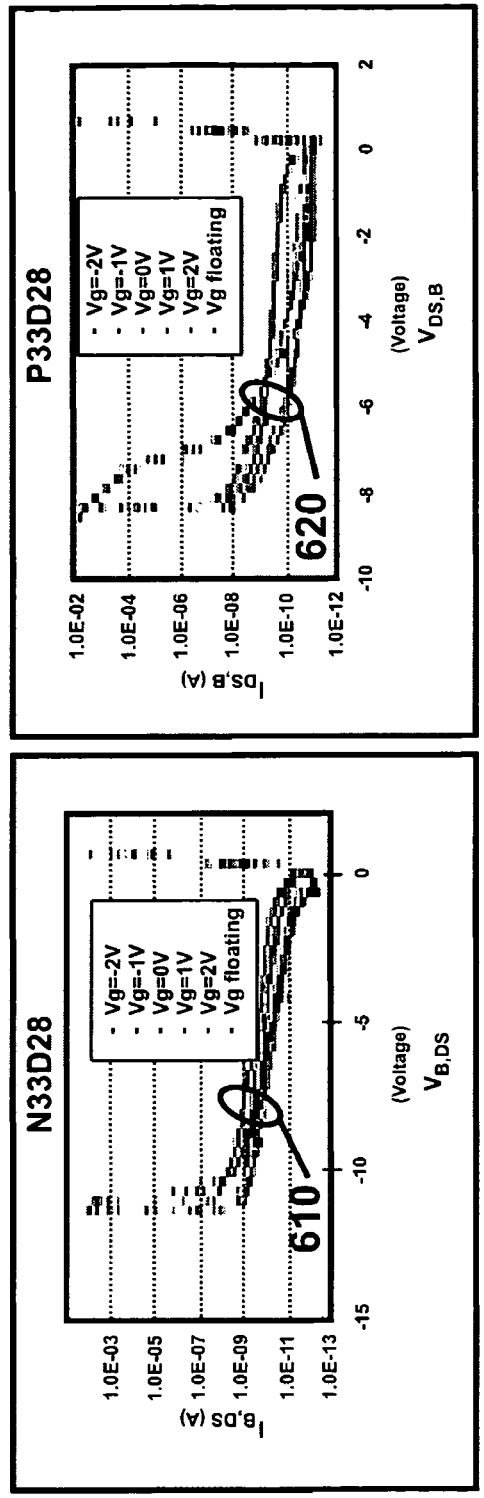
FIGS. 7(A) and (B) are simplified diagrams showing reduction of breakdown voltage for I/O transistors according to some embodiments of the present invention.

FIGS. 7(A) and (B) are simplified diagrams showing reduction of breakdown voltage for I/O transistors according to some embodiments of the present invention. These diagrams are merely examples, which should not unduly limit the scope of the claims. One of ordinary skill in the art would recognize many variations, alternatives, and modifications. FIGS. 7(A) and (B) correspond to the NMOS I/O transistors and the PMOS I/O transistors as shown in FIG. 6.

As shown in FIG. 7(A), curves 610 represent the magnitudes of transistor current $I_{B,DS}$ measured as a function of the transistor voltage $V_{B,DS}$. The current $I_{B,DS}$ flows from the bulk region to the drain and source regions of the NMOS I/O transistor. The transistor voltage $V_{B,DS}$ represents the voltage drop from the bulk region to the drain and source regions, and the drain and source regions are at the same voltage potential. During measurements, the polysilicon region 540 is floating or biased to various voltages. For example, the polysilicon region 540 is biased to 2, 1, 0, −1, and −2 volts. The comparison of the curves 610 and 320 indicates addition of the polysilicon region 540 can significantly reduce magnitude of the breakdown voltage. For example, the reduction equals about 1.5 volts. Additionally, a small positive bias applied to the polysilicon region 540 can further lower the magnitude of the breakdown voltage. As shown in FIG. 7(B), curves 620 represent the magnitudes of transistor current $I_{DS,B}$ measured as a function of the transistor voltage $V_{DS,B}$. The current $I_{DS,B}$ flows from the drain and source regions to the bulk region of the PMOS I/O transistor. The transistor voltage $V_{DS,B}$ represents the voltage drop from the drain and source regions to the bulk region, and the drain and source regions are at the same voltage potential. During measurements, the polysilicon region 540 is floating or biased to various voltages. For example, the polysilicon region 540 is biased to 2, 1, 0, −1, and −2 volts. The comparison of the curves 620 and 320 indicates addition of the polysilicon region 540 can significantly reduce magnitude of the breakdown voltage. For example, the reduction equals about 1.5 volts. Additionally, a small negative bias applied to the polysilicon region 540 can further lower the magnitude of the breakdown voltage.

Figure 8:
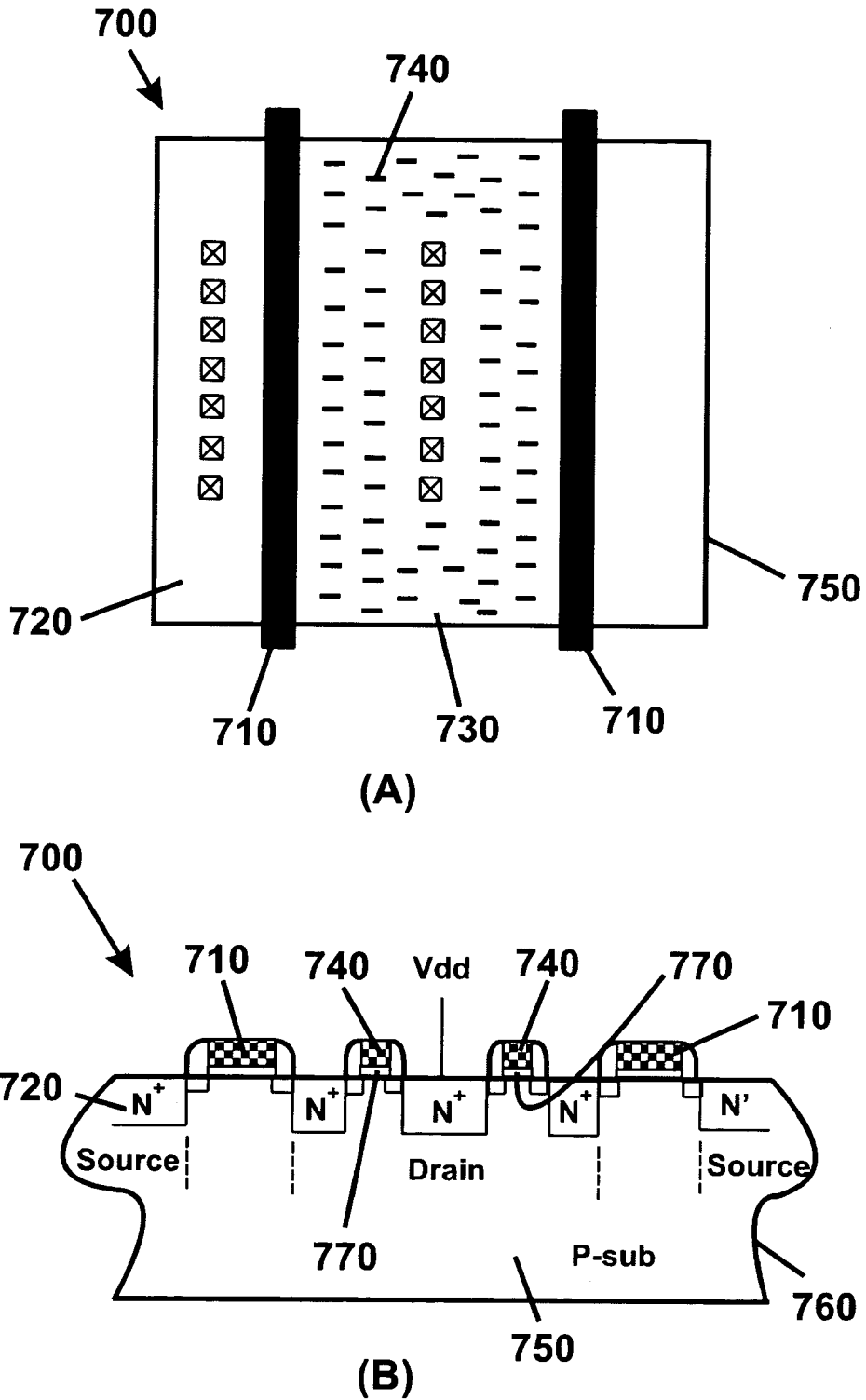
FIGS. 8(A) and (B) are simplified diagrams showing system for electrostatic discharge protection according to yet another embodiment of the present invention.

FIGS. 8(A) and (B) are simplified diagrams showing system for electrostatic discharge protection according to yet another embodiment of the present invention. This diagram is merely an example, which should not unduly limit the scope of the claims. One of ordinary skill in the art would recognize many variations, alternatives, and modifications. The system 700 includes the following components:

1. Gate regions 710;
2. Source regions 720;
3. Drain regions 730;
4. Polysilicon regions 740;
5. Active area 750;
6. Substrate 760;
7. Dielectric layers 770.

Although the above has been shown using a selected group of components for the system 700, there can be many alternatives, modifications, and variations. For example, some of the components may be expanded and/or combined. Other components may be inserted to those noted above. For example, the regions 720 can serve as drains, and the regions 730 can serve as sources. Depending upon the embodiment, the arrangement of components may be interchanged with others replaced. For example, the I/O transistors in the active area 750 are PMOS transistors. Further details of these components are found throughout the present specification and more particularly below.

The gate regions 710, the source regions 720, and the drain regions 730 are used to form I/O transistors in the active area 750. For example, the active area 750 includes the source regions 720 and the drain regions 730. In another example, the I/O transistors in the active area 750 are NMOS transistors.

As shown in FIG. 8(A), the polysilicon regions 740 are not in direct contact with the gate regions 710, and the polysilicon regions 740 are not in direct contact with each other. In one embodiment, the polysilicon regions 740 are located within the drain regions 730 in the top view. In another embodiment, the polysilicon regions 740 are located within the source regions 720 in the top view. In yet another embodiment, the polysilicon regions 740 are located within both the source regions 720 and the drain regions 730 in the top view. In yet another embodiment, the gate regions 710 are electrically shorted to each other by another polysilicon region located outside the active region 750.

As shown in FIG. 8(B), the substrate 760 includes the active area 750, and is separated from the polysilicon regions 740 by the dielectric layers 770. For example, the dielectric layers 770 include silicon oxide. In another example, the dielectric layers 770 are separated from each other or in direct contact with each other. Each of the source regions 720 includes a doped region, and each of the drain regions 730 includes several doped regions in the substrate 760. The doped regions are not in direct contact with each other. In one embodiment, the substrate 760 is doped to p-type, and the doped regions are N+ regions. For example, the substrate 760 also includes a p-well. In another example, the substrate 760 also includes at least two LDD regions for each of the doped regions. The two LDD regions are in direct contact with the corresponding doped region. In yet another example, the substrate 760 also includes two p-type regions made by pocket implants for each of the doped regions.

Figure 9A:
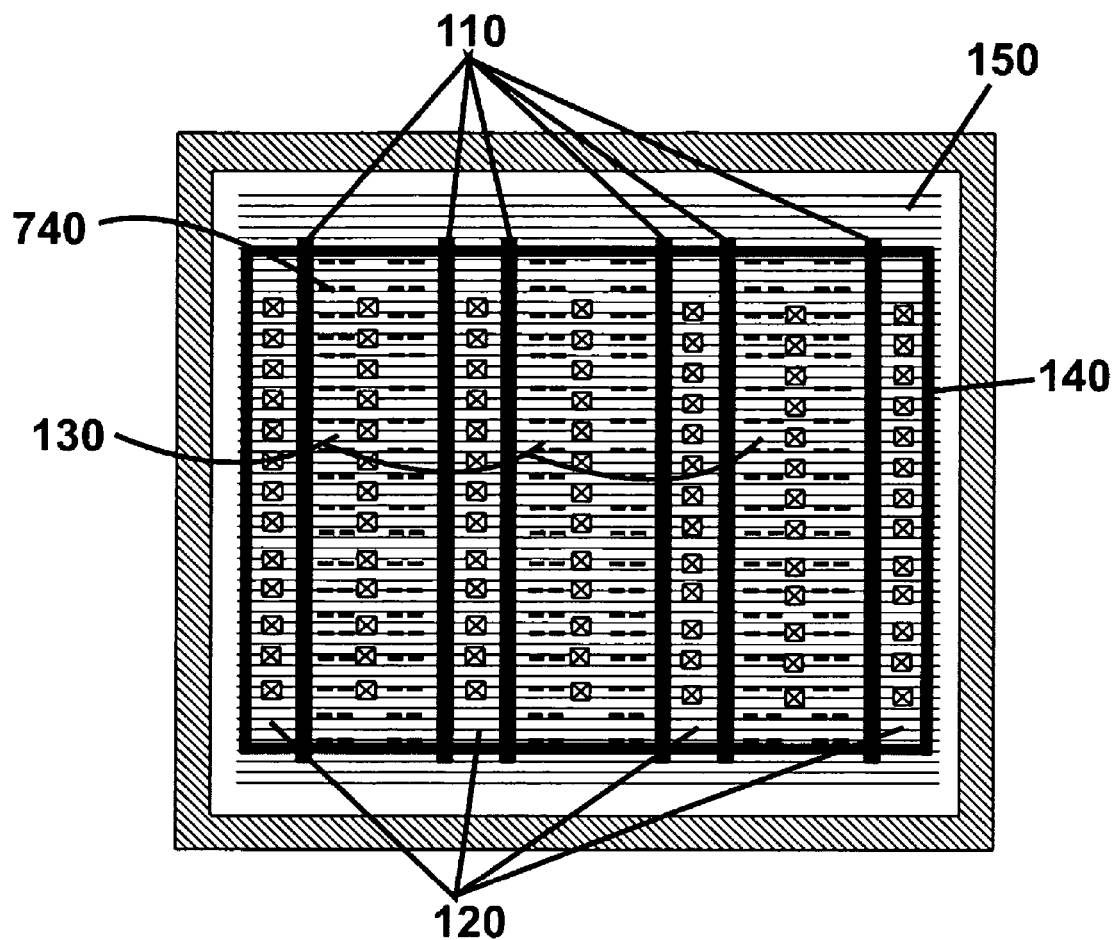
FIGS. 9(A), (B), and (C) are simplified diagrams showing systems for electrostatic discharge protection according to yet other embodiments of the present invention.
Figure 9A:
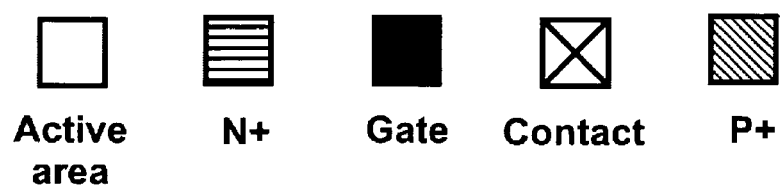

As discussed above and further emphasized here, FIGS. 8(A) and (B) are merely examples, which should not unduly limit the scope of the claims. One of ordinary skill in the art would recognize many variations, alternatives, and modifications. FIGS. 9(A), (B), and (C) are simplified diagrams showing systems for electrostatic discharge protection according to yet other embodiments of the present invention. These diagrams are merely examples, which should not unduly limit the scope of the claims. One of ordinary skill in the art would recognize many variations, alternatives, and modifications.

As shown in FIG. 9(A), the polysilicon regions 740 are added to the system 100 as shown in FIG. 2. The polysilicon regions 740 are not in direct contact with the gate regions 110 or the polysilicon regions 140, and the polysilicon regions 740 are not in direct contact with each other. Additionally, the polysilicon regions 740 are separated from the substrate by the dielectric layers. For example, the dielectric layers include silicon oxide. In another example, the dielectric layers are separated from each other or in direct contact with each other. In one embodiment, the polysilicon regions 740 are located within the drain regions 130 in the top view. In another embodiment, the polysilicon regions 740 are located within the source regions 120 in the top view. In yet another embodiment, the polysilicon regions 740 are located within both the source regions 120 and the drain regions 130 in the top view. For example, each of the drain regions 130 includes several doped regions in the substrate. The doped regions are not in direct contact with each other. In one embodiment, the substrate is doped to p-type, and the doped regions are N+ regions. For example, the substrate also includes a p-well. In another example, the substrate also includes at least two LDD regions for each of the doped regions. The two LDD regions are in direct contact with the corresponding doped region. In yet another example, the substrate also includes two p-type regions made by pocket implants for each of the doped regions. In yet another embodiment, the gate regions 110 are electrically shorted to each other by another polysilicon region located outside the active area 150.

Figure 9B:
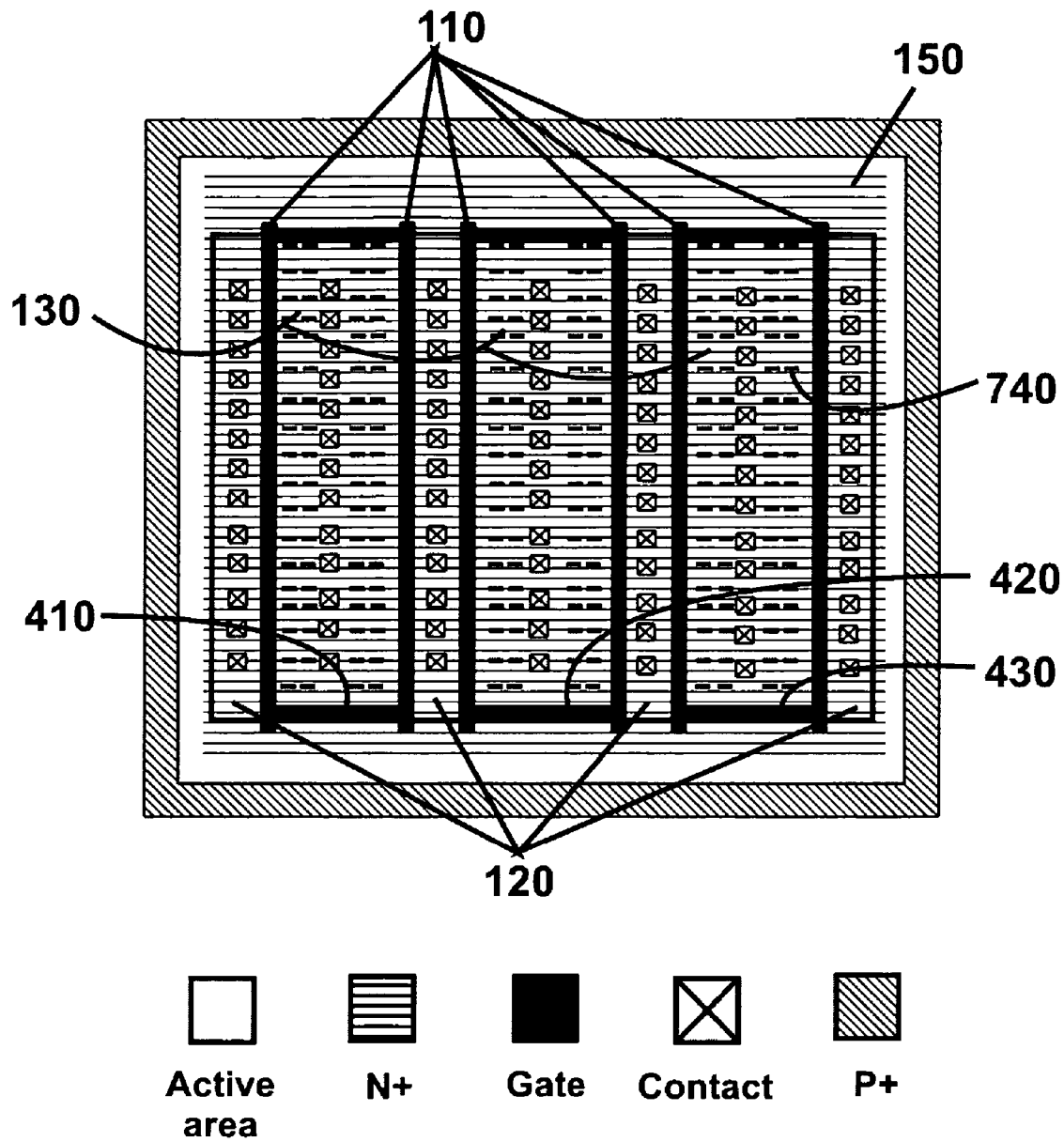

As shown in FIG. 9(B), the polysilicon regions 740 are added to the system 100 as shown in FIG. 5. The polysilicon regions 740 are not in direct contact with the gate regions 110 or the polysilicon regions 410, 420, and 430, and the polysilicon regions 740 are not in direct contact with each other. Additionally, the polysilicon regions 740 are separated from the substrate by the dielectric layers. For example, the dielectric layers include silicon oxide. In another example, the dielectric layers are separated from each other or in direct contact with each other. In one embodiment, the polysilicon regions 740 are located within the drain regions 130 in the top view. In another embodiment, the polysilicon regions 740 are located within the source regions 120 in the top view. In yet another embodiment, the polysilicon regions 740 are located within both the source regions 120 and the drain regions 130 in the top view. For example, each of the drain regions 130 includes several doped regions in the substrate. The doped regions are not in direct contact with each other. In one embodiment, the substrate is doped to p-type, and the doped regions are N+ regions. For example, the substrate also includes a p-well. In another example, the substrate also includes at least two LDD regions for each of the doped regions. The two LDD regions are in direct contact with the corresponding doped region. In yet another example, the substrate also includes two p-type regions made by pocket implants for each of the doped regions. In yet another embodiment, the gate regions 110 are electrically shorted to each other by another polysilicon region located outside the active area 150.

Figure 9C:
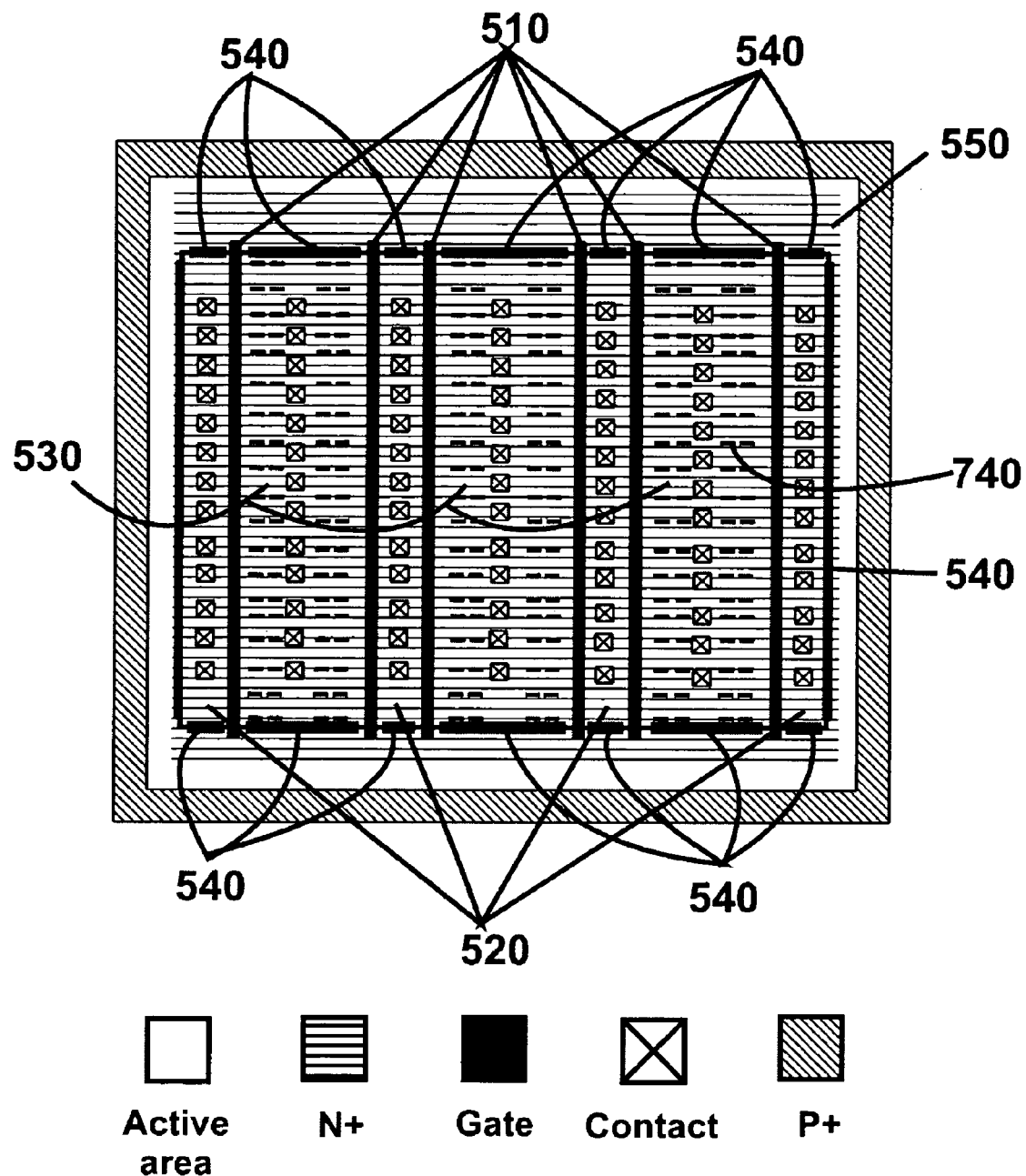

As shown in FIG. 9(C), the polysilicon regions 740 are added to the system 500 as shown in FIG. 6. The polysilicon regions 740 are not in direct contact with the gate regions 110 or the polysilicon regions 540, and the polysilicon regions 740 are not in direct contact with each other. Additionally, the polysilicon regions 740 are separated from the substrate by the dielectric layers. For example, the dielectric layers include silicon oxide. In another example, the dielectric layers are separated from each other or in direct contact with each other. In one embodiment, the polysilicon regions 740 are located within the drain regions 530 in the top view. In another embodiment, the polysilicon regions 740 are located within the source regions 520 in the top view. In yet another embodiment, the polysilicon regions 740 are located within both the source regions 520 and the drain regions 530 in the top view. For example, each of the drain regions 530 includes several doped regions in the substrate. The doped regions are not in direct contact with each other. In one embodiment, the substrate is doped to p-type, and the doped regions are N+ regions. For example, the substrate also includes a p-well. In another example, the substrate also includes at least two LDD regions for each of the doped regions. The two LDD regions are in direct contact with the corresponding doped region. In yet another example, the substrate also includes two p-type regions made by pocket implants for each of the doped regions. In yet another embodiment, the gate regions 510 are electrically shorted to each other by another polysilicon region located outside the active area 550.

Figure 10:
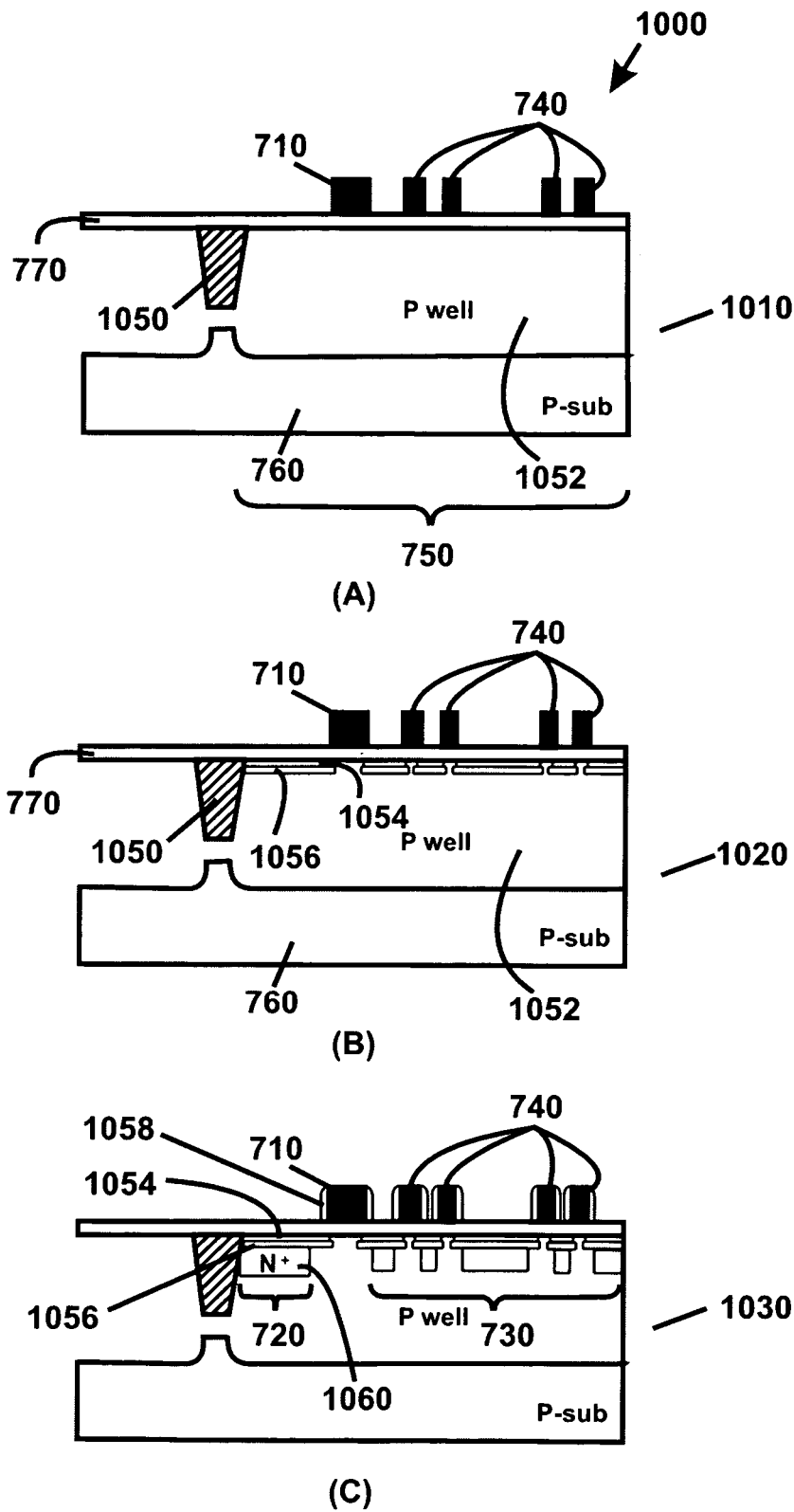
FIGS. 10(A), (B) and (C) show a simplified method for making system for electrostatic discharge protection according to an embodiment of the present invention.

FIGS. 10(A), (B) and (C) show a simplified method for making the system 700 for electrostatic discharge protection according to an embodiment of the present invention. These diagrams are merely examples, which should not unduly limit the scope of the claims. One of ordinary skill in the art would recognize many variations, alternatives, and modifications. The method 1000 includes the following processes:

1. Process 1010 for forming gate regions and polysilicon regions;
2. Process 1020 for forming LDD regions and pocket implant regions;
3. Process 1030 for forming spacers and heavily doped regions.

Although the above has been shown using a selected group of processes for the method 1000, there can be many alternatives, modifications, and variations. For example, some of the processes may be expanded and/or combined. Other processes may be inserted to those noted above. Depending upon the embodiment, the arrangement of processes may be interchanged with others replaced. Further details of these components are found throughout the present specification and more particularly below.

At the process 1010, the gate regions 710 and the polysilicon regions 740 are formed on the dielectric layers 770 as shown in FIG. 10(A). For example, the dielectric layers 770 form a contiguous dielectric layer. The dielectric layers 770 are on the substrate 760, which includes the active area 750 adjacent to an isolation region 1050. For example, the substrate 760 is doped to p-type, and the active area 750 includes a p-well 1052.

At the process 1020, LDD regions 1054 and pocket implant regions 1056 are formed as shown in FIG. 10(B). In one embodiment, the substrate 760 is doped to p-type, and the active area 750 includes a p-well 1052. The LDD regions 1054 are doped n-type, and the pocket implant regions 1056 are doped to p-type.

At the process 1030, spacers 1058 and heavily doped regions 1060 are formed as shown in FIG. 10(C). In one embodiment, the substrate 760 is doped to p-type, and the active area 750 includes a p-well 1052. The LDD regions 1054 are doped to n-type, and the pocket implant regions 1056 are doped to p-type. Additionally, the regions 1060 are doped to n-type. For example, on one side of the gate regions 710, the regions 1054, 1056, and 1060 form the source regions 720, and one another side of the gate regions 710, the regions 1054, 1056, and 1060 form the drain regions 730.

As discussed above and further emphasized here, FIGS. 10(A), (B) and (C) are merely examples, which should not unduly limit the scope of the claims. One of ordinary skill in the art would recognize many variations, alternatives, and modifications. For example, the method 1000 can be modified to make the system according to FIG. 2, FIG. 3, FIG. 5, FIG. 6, FIG. 9(A), FIG. 9(B), and/or FIG. 9(C). In one embodiment, the processes used for making the I/O transistors are also used to make the polysilicon regions, the dielectric layers located between the polysilicon regions and the substrate, the heavily doped regions, the LDD regions, and the pocket implant regions.

Figure 11:
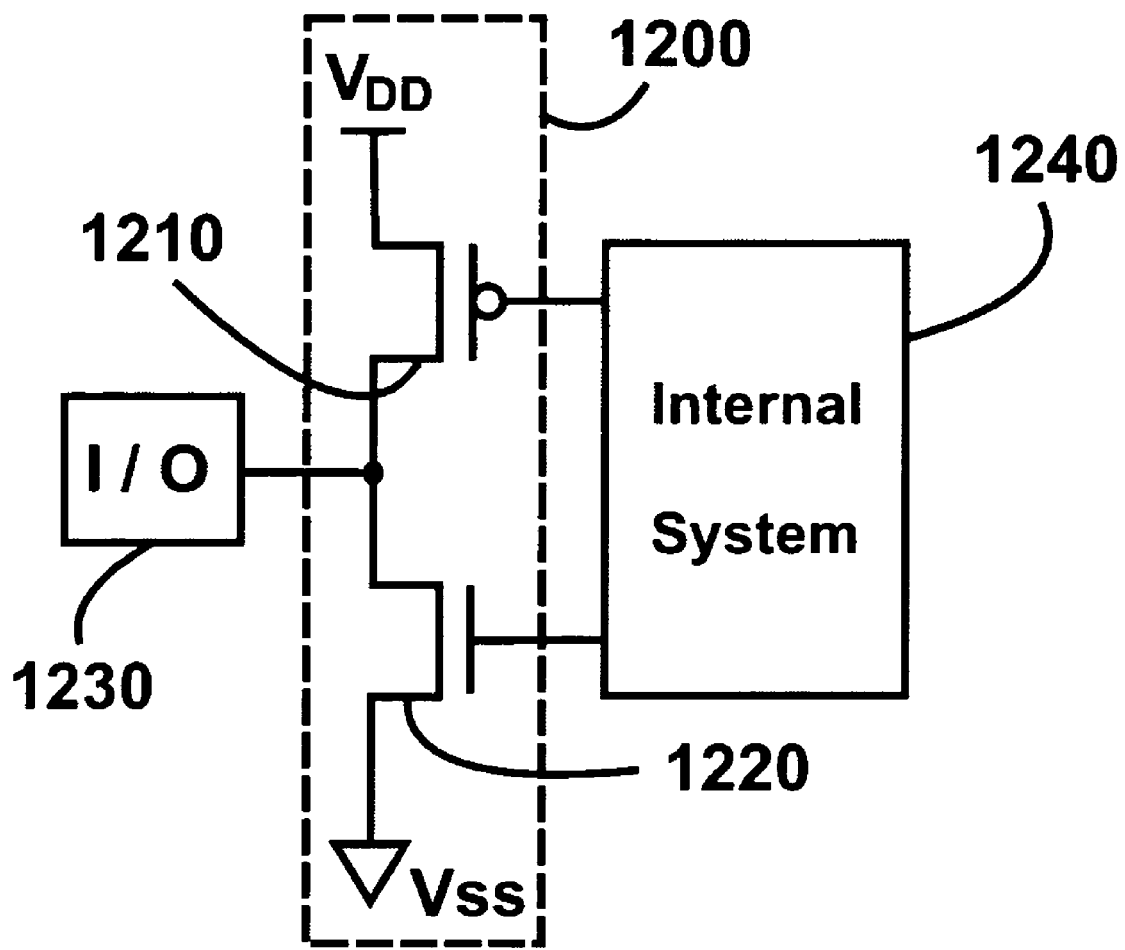
FIG. 11 is a simplified system for electrostatic discharge protection according to yet another embodiment of the present invention.

FIG. 11 is a simplified system for electrostatic discharge protection according to yet another embodiment of the present invention. This diagram is merely an example, which should not unduly limit the scope of the claims. One of ordinary skill in the art would recognize many variations, alternatives, and modifications. The system 1200 includes a PMOS transistor 1210 and an NMOS transistor 1220. The source of the PMOS transistor 1210 is biased to a voltage level $V_{DD}$, and the source of the NMOS transistor 1220 is biased to a voltage level $V_{SS}$. The drain of the PMOS transistor 1210 and the drain of the NMOS transistor 1220 are connected to an I/O pad 1230, and the gate of the PMOS transistor 1210 and the gate of the NMOS transistor 1220 are connected to an internal system 1240. For example, the internal system 1240 is protected by the system 1200. In another example, the internal system 1240 includes one or more core transistors and/or is coupled to one or more core transistors. The PMOS transistor 1210 represents one or more I/O transistors and the NMOS transistor 1220 represents one or more I/O transistors as shown in FIG. 2, FIG. 3, FIG. 5, FIG. 6, FIG. 8(A), FIG. 8(B), FIG. 9(A), FIG. 9(B), and/or FIG. 9(C). For example, the system 1200 includes one or more pairs of I/O transistors, and each pair of I/O transistors includes an NMOS transistor and a PMOS transistor.

According to another embodiment of the present invention, a system for electrostatic discharge protection includes a plurality of transistors. The plurality of transistors includes a plurality of gate regions, a plurality of source regions, and a plurality of drain regions. The plurality of source regions and the plurality of drain regions are located within an active area in a substrate, and the active area is adjacent to at least an isolation region in the substrate. Additionally, the system includes a polysilicon region. The polysilicon region is separated from the substrate by a dielectric layer, and the polysilicon region intersects each of the plurality of gate regions. At least a part of the polysilicon region is on the active area. For example, the system is implemented according to FIG. 2, FIG. 3, and/or FIG. 9(A).

For example, the active area is surrounded by at least the isolation region in the substrate. In another example, the system also includes a plurality of polysilicon regions, and the plurality of polysilicon regions is separated from the substrate by a plurality of dielectric layers. In yet another example, the plurality of polysilicon regions is on one of the plurality of drain regions or one of the plurality of source regions, the plurality of polysilicon regions are not in direct contact with each other, and each of the plurality of polysilicon region is not in direct contact with anyone of the plurality of gate regions. In yet another example, in a top view the polysilicon region is at least partially located within the active region and surrounds the plurality of source regions and the plurality of the drain regions. In yet another example, the top view is directed to a surface of the substrate, the dielectric layer being on the surface.

According to yet another embodiment of the present invention, a system for electrostatic discharge protection includes a plurality of transistors. The plurality of transistors includes a plurality of gate regions, a plurality of source regions, and a plurality of drain regions. The plurality of source regions and the plurality of drain regions are located within an active area in a substrate, and the active area is adjacent to at least an isolation region in the substrate. Additionally, the system includes a first plurality of polysilicon regions. The first plurality of polysilicon regions is separated from the substrate by a first plurality of dielectric layers. At least a part of each of the first plurality of polysilicon regions is on the active area, and the first plurality of polysilicon regions are not in direct contact with each other. For example, the system is implemented according to FIG. 5, FIG. 6, FIG. 9(B), and/or FIG. 9(C).

For example, each of the first plurality of polysilicon regions intersects at least one of the plurality of gate regions. In another example, each of the first plurality of polysilicon regions does not intersect anyone of the plurality of gate regions. In yet another example, the active area is surrounded by at least the isolation region in the substrate. In yet another example, the system also includes a second plurality of polysilicon regions, and the second plurality of polysilicon regions being separated from the substrate by a second plurality of dielectric layers. In yet another example, the second plurality of polysilicon regions is on one of the plurality of drain regions or one of the plurality of source regions, the second plurality of polysilicon regions are not in direct contact with each other, and each of the second plurality of polysilicon region is not in direct contact with anyone of the plurality of gate regions. In yet another example, in a top view each of the plurality of polysilicon regions is at least partially located within the active region. In yet another example, the top view is directed to a surface of the substrate, and the plurality of dielectric layers are on the surface. In yet another example, each of the plurality of polysilicon regions intersects at least one of the plurality of gate regions, and in the top view the plurality of polysilicon regions and the plurality of gate regions surround the plurality of drain regions respectively. In yet another example, each of the plurality of polysilicon regions does not intersect anyone of the plurality of gate regions, and in the top view the plurality of polysilicon regions and the plurality of gate regions are around the plurality of drain regions respectively. In yet another example, the plurality of dielectric layers includes a first dielectric layer and a second dielectric layer, and the first dielectric layer and the second dielectric layer are separated from or in contact with each other.

According to yet another embodiment of the present invention, a system for electrostatic discharge protection includes a plurality of transistors. The plurality of transistors includes a plurality of gate regions, a plurality of source regions, and a plurality of drain regions. The plurality of source regions and the plurality of drain regions are located within an active area in a substrate, and the active area is adjacent to at least an isolation region in the substrate. Additionally, the system includes a plurality of polysilicon regions. The plurality of polysilicon regions is separated from the substrate by a plurality of dielectric layers. The plurality of polysilicon regions is on one of the plurality of drain regions or one of the plurality of source regions. The plurality of polysilicon regions is not in direct contact with each other, and each of the plurality of polysilicon region is not in direct contact with anyone of the plurality of gate regions. For example, the system is implemented according to FIG. 8(A), FIG. 8(B), FIG. 9(A), FIG. 9(B), and/or FIG. 9(C).

For example, the plurality of polysilicon regions is on one of the plurality of drain regions and one of the plurality of source regions. In another example, in a top view the plurality of polysilicon regions is within one of the plurality of drain regions or one of the plurality of source regions, the top view is directed to a surface of the substrate, and the plurality of dielectric layers is on the surface. In yet another example, the plurality of dielectric layers includes a first dielectric layer and a second dielectric layer, and the first dielectric layer and the second dielectric layer are separated from or in contact with each other. In yet another example, the plurality of polysilicon regions is on one of the plurality of drain regions, and the one of the plurality of drain regions includes a plurality of doped regions. Each of the plurality of doped regions corresponds to one of the plurality of polysilicon regions, and the plurality of doped regions are not in direct contact with each other.

The present invention has various advantages. Some embodiments of the present invention improve the I/O ESD protection technique. For example, the junction breakdown voltages of MOS transistors are lowered. In another example, the I/O transistors can turn on junction breakdown and thus prevent or reduce damages for self-protection from ESD stress. Certain embodiments of the present invention can effectively delay the time when the ESD stress current reaches the gate regions. For example, as shown in FIGS. 7(A) and (B) and 8(A), (B), and (C), the channels formed under the polysilicon regions 740 have significant resistance, which can lengthen the current paths. Some embodiments of the present invention comply with the ESD design rule. For example, to dissipate significant heat generated by high-density ESD current, the ESD design rule often allows relatively large spacing between the gate regions and drain contacts as shown in FIGS. 8(A) and (B) and 9(A), (B), and (C). In another example, the spacing is equal to or longer than 1.72 μm. Accordingly, the polysilicon regions 740 can be inserted to the drain regions of the I/O transistors in order to increase lengths of the current paths and raise the drain resistance without violating the ESD design rule. Certain embodiments of the present invention provide pocket implant regions adjacent to floating and/or biased polysilicon regions. For example, the pocket implant regions are made with the pocket implant process used for making I/O transistors. In another example, the pocket implant is more heavily doped than p-well in the substrate, and the source and drain regions include N+ regions. The pocket implant regions and the N+ regions form abrupt junctions with low junction breakdown voltage.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for electrostatic discharge protection, the system comprising:

a plurality of transistors, the plurality of transistors including a plurality of gate electrodes formed in parallel, a plurality of source regions, and a plurality of drain regions, the plurality of source regions and the plurality of drain regions being located within an active area in a substrate, the active area being adjacent to at least an isolation region in the substrate; and a polysilicon region, the polysilicon region not being part of the gate regions and completely enclosing the plurality of source and drain regions in a top view, and separated from the substrate by a dielectric layer;

wherein a first part of the polysilicon region intersects each of the plurality of gate regions at two distal ends, each of the gate electrodes having a first side associated with one of the source regions extending continuously along the first side between the two distal ends and a second side associated with one of the drain regions extending continuously along the second side between the two distal ends, wherein the plurality of gate electrodes is not mesh-shaped or grid-shaped;

wherein each one of the source regions comprises at least a source contact;

wherein each one of the drain regions comprises at least a drain contact;

wherein a second part of the polysilicon region on the active area is disposed along an inner peripheral edge of the active area, the inner peripheral edge of the active area being adjacent to the at least an isolation region, wherein the second part of the polysilicon region on the active area does not intersect the plurality of gate electrodes.

2. The system of claim 1 wherein the active area is surrounded by at least the isolation region in the substrate, the isolation region being one of a shallow trench isolation region and a field oxide region.

3. The system of claim 1 wherein:

the polysilicon region is electrically connected to each of the plurality of gate electrodes and the polysilicon region is maintained at substantially the same potential as each of the plurality of gate electrodes.

4. The system of claim 1 wherein the polysilicon region is at least partially overlying the active area.

5. The system of claim 1 wherein the plurality of source regions and the plurality of drain regions comprise N+ regions.

6. The system of claim 5 wherein the substrate comprises two LDD regions for each of the N+ regions.

7. The system of claim 1 wherein the substrate comprises a p-well.

8. The system of claim 6 wherein the two LDD regions for a corresponding N+ region are in direct contact with the corresponding N+ region.

9. The system of claim 6 wherein the two LDD regions comprise a pocket implant region and a first LDD region.

10. The system of claim 9 wherein pocket implant region is p-type doped.

11. The system of claim 9 wherein the first LDD region is n-type doped.

12. The system of claim 1 wherein the plurality of transistors comprises input/output (I/O) transistors.

* * * * *